(12) United States Patent
Fisher et al.

(10) Patent No.: US 6,710,368 B2
(45) Date of Patent: Mar. 23, 2004

(54) QUANTUM TUNNELING TRANSISTOR

(76) Inventors: Ken Scott Fisher, 5521 Cleon Ave., North Hollywood, CA (US) 91601; Kevin Cotton Baxter, 5521 Cleon Ave., North Hollywood, CA (US) 91601

( * ) Notice: Subject to any disclaimer, the term of this patent is extended or adjusted under 35 U.S.C. 154(b) by 0 days.

(21) Appl. No.: 10/227,722

(22) Filed: Aug. 26, 2002

(65) Prior Publication Data

US 2003/0062560 A1 Apr. 3, 2003

Related U.S. Application Data

(60) Provisional application No. 60/326,625, filed on Oct. 1, 2001.

(51) Int. Cl.$^7$ ............................................... H01L 29/08
(52) U.S. Cl. ........................... 257/39; 257/24; 257/299
(58) Field of Search ........................... 257/14, 24, 299, 257/39

(56) References Cited

U.S. PATENT DOCUMENTS 5,225,362 A * 7/1993 Bergemont ................. 438/261
5,241,190 A * 8/1993 Eisenstein et al. ............. 257/24
5,825,049 A * 10/1998 Simmons et al. .............. 257/25

FOREIGN PATENT DOCUMENTS

JP     06310705 A  * 11/1994   ........... H01L/29/06

* cited by examiner

*Primary Examiner*—Allan R. Wilson

(57) ABSTRACT

A quantum tunneling transistor which provides two switching inputs, for example source and drain as with a conventional FET, and a control input which, in one embodiment, performs much like the gate input of a conventional FET. In one embodiment, charge pump circuitry is integrated onto the semiconductor substrate material of the transistor to provide a plurality of switching voltages to the transistor. The circuitry is configured such that switching of the transistor is controlled by a single, high impedance input, thus allowing the use of the quantum tunneling transistor in existing applications.

8 Claims, 2 Drawing Sheets

QUANTUM TUNNELING TRANSISTOR

CROSS-REFERENCE TO RELATED APPLICATION

This application claims the benefit of the filing date of provisional application entitled "Quantum Tunneling Transistor", Serial No. 60/326,625, filed Oct. 1, 2001, and fully incorporated herein.

BACKGROUND

1) Field of the Invention

The present invention relates to a quantum tunneling transistor. More particularly, but not by way of limitation, the present invention relates to a three pin quantum tunneling transistor which may be readily substituted for prior art devices such as transistors, MOSFETs, IGBTs, and the like.

2) Background of the Invention

While the development of quantum tunneling transistors has been ongoing for several years, it is only recently that great strides have been made towards achieving a device practical for every day applications. Unfortunately, the quantum tunneling transistors which show the greatest promise for use in practical applications also require complex switching schemes and are thus not readily adapted to present designs.

Generally speaking, the term "quantum tunneling" is used to describe a phenomenon wherein electrons cross a dielectric boundary based on a probability model, despite the fact that, in theory, electrical current should not flow through the insulator. It is accepted that tunneling electrons behave like a wave, rather than a particle. The quantum tunneling effect has shown great promise in a number of electronic components such as varistors and diodes, as well as transistor devices. Important features of such devices are, by way of example and not limitation: dramatic improvement in switching speeds over prior art devices; negative resistance in transitioning from the off state to the on state; exceptionally low on resistance; good consistency between parts; etc. As will be apparent to those skilled in the art, these properties make the quantum tunneling transistor particularly well suited to a variety of relatively high power applications such as radio frequency circuitry and DC motor controls.

It should be noted that, at least to some degree, quantum tunneling devices, whether transistor or varistor devices, are operated at a voltage sufficient to cause tunneling, but below a voltage which causes breakdown of the dielectric. It will thus be apparent to those skilled in the art that the selection of the insulating material, or layer, is crucial to operation of the device in that it must exhibit a dielectric strength sufficient to avoid breakdown during normal operation of the device.

It should be mentioned too, that much of the development of quantum tunneling transistors appears to be centered about the use of such devices in highly integrated circuitry (i.e., microprocessors, memory device, and the like). As should be apparent to those skilled in the art, quantum tunneling transistors also exhibit properties which are particularly well suited for use in moderate to high power applications. In particular, low on-resistance and exceptionally fast switching speeds make these devices attractive for use in RF and motor control applications. Unfortunately, the topology favored for use in integrated circuits is not particularly well suited for use in power switching circuits.

Presently this has resulted in the appearance of devices which, on the one hand, use unconventional means to control the gate, or base, input of the device, such as light (using photons to initiate tunneling) or mechanical vibration and, on the other hand, devices which require multiple voltages at multiple gate inputs (sometimes referred to as 5-pin devices) to initiate tunneling. Neither method is well suited to adapting presently designed equipment for use with quantum tunneling transistors.

It is thus an object of the present invention to provide a quantum tunneling transistor which is adapted to operate in a manner similar to a bipolar transistor, MOSFET, IGBT, or the like.

It is still a further object of the present invention to provide a variety of circuits wherein the particular features of the quantum tunneling transistor produce surprising and unexpected improvements in such circuits.

SUMMARY OF THE INVENTION

The present invention provides a quantum tunneling transistor which provides two switching inputs (for example, source and drain as with a conventional FET) and a control input which, in one embodiment, performs much like the gate input of a conventional FET. In one embodiment, circuitry is integrated onto the semiconductor substrate material of the transistor to provide a plurality of switching voltages to the transistor. The circuitry is configured such that switching of the transistor is controlled by a single, high impedance input, thus allowing the use of the quantum tunneling transistor in existing applications.

In another embodiment, a quantum tunneling transistor, such as the device described above, is used to directly drive a resonant circuit coupled to an antenna to provide a single transistor, high power RF power amplifier.

In yet another preferred embodiment, a quantum tunneling transistor, such as the device described above, is incorporated into a DC motor controller. The fast transition times and low on-state resistance of the quantum tunneling transistor provide an unexpected cost reduction, allowing the use of notably smaller heat sinks and simpler drive circuitry than was allowed with prior art devices.

In still another embodiment, a quantum tunneling transistor, such as the device described above, is incorporated into an integrated circuit. Of particular interest is the three-pin nature of the inventive device which allows its use as a "drop-in" replacement in existing circuit designs.

Further objects, features, and advantages of the present invention will be apparent to those skilled in the art upon examining the accompanying drawings and upon reading the following description of the preferred embodiments.

DESCRIPTION OF THE PREFERRED EMBODIMENTS

Before explaining the present invention in detail, it is important to understand that the invention is not limited in its application to the details of the construction illustrated and the steps described herein. The invention is capable of other embodiments and of being practiced or carried out in a variety of ways. It is to be understood that the phraseology and terminology employed herein is for the purpose of description and not of limitation.

Figure 1:
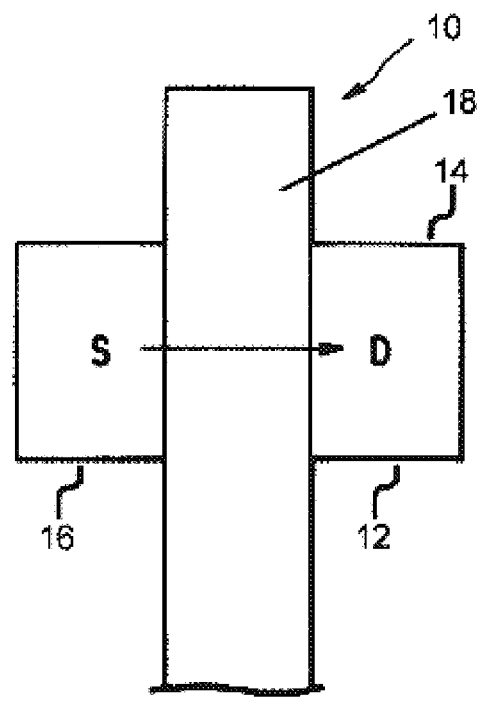
FIG. 1 provides a block diagram of a typical quantum tunneling transistor.

Referring now to the drawings, wherein like reference numerals indicate the same parts throughout the several views, a typical quantum tunneling transistor 10 is shown in FIG. 1. Preferably, transistor 10 is of a topology similar in nature to a field effect transistor (FET, MOSFET, etc.) and includes: a semiconducting substrate 12; a drain region 14 of substrate 12; a source region 16 of substrate 12; and a quantum tunneling element 18 separating drain region 14 and source region 16. Quantum tunneling element 18 is a dielectric material or a non-conducting region of substrate 12. When the device is in the "off" state, virtually no electrons cross tunneling element 18. When, due to an externally applied excitation, electrons begin to tunnel across element 18, the device transitions into its "on" state. In prior art devices, tunneling has been activated by the release of photons in element 18, mechanical vibration, or increased electric field.

Figure 2:
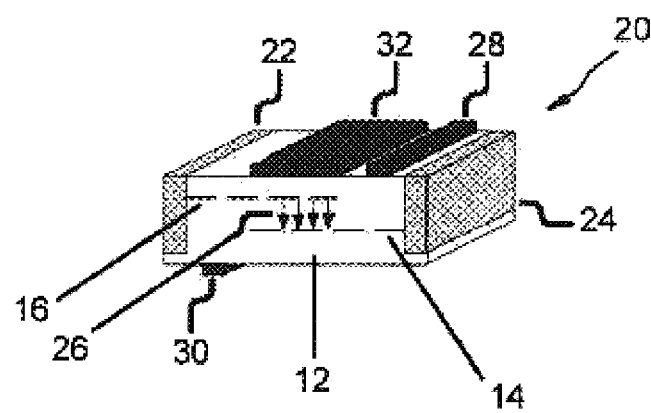
FIG. 2 provides a perspective view of a quantum tunneling transistor having a 5-pin configuration.

Of particular interest, is the construction of a quantum tunneling device wherein tunneling is controlled by the application of an electric field, as in the application of a voltage to one or more gate inputs, as with the device shown in FIG. 2. In a transistor 20, a conductor 22 is in electrical communication with a source region 16 disposed along the upper surface of substrate 12. Likewise, a second conductor 24 is in electrical communication with a drain region 14 disposed along the lower surface of substrate 12. The quantum tunneling region 26 (as indicated by the downward pointing arrows in FIG. 2) between drain region 14 and source region 16 is typically depleted of electrons and hence, nonconductive. In operation, the precise thickness of the quantum tunneling region 26 is controlled by voltages applied to the top gate 28 and back gate 30. Tunneling is then controlled by application of an appropriate voltage to control gate 32. As will be apparent to those skilled in the art, operation of this device is considerably more complex than that of a conventional transistor.

Figure 3:
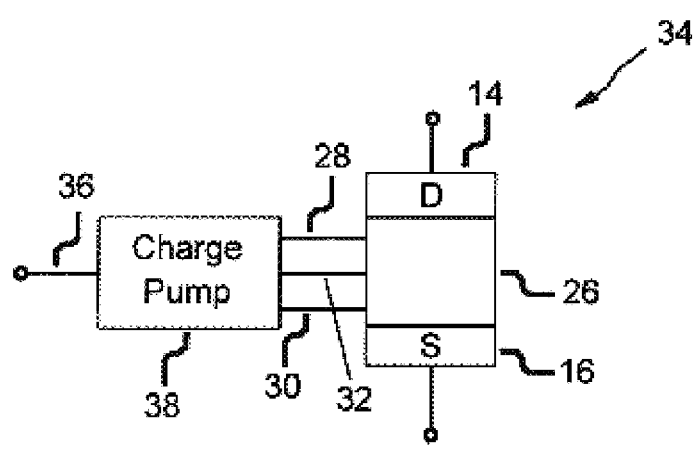
FIG. 3 provides a block diagram of a quantum tunneling transistor adapted to a three-pin configuration.

Referring next to FIG. 3, in order to simplify implementation of the device, it is possible to generate the voltages required for the top gate 28 and back gate 30 in the device. One method for accomplishing this is incorporated in quantum tunneling transistor 34 which includes: drain region 14; source region 16; quantum tunneling region 26 insulating drain 14 from source 16; gate input 36; and charge pump 38. Charge pumps are well known in the art and often used to synthesize voltages required for the operation of a device. As will be apparent to those skilled in the art, charge pump 38 would most preferably be fabricated directly on the substrate 12 forming transistor 34.

Typically, charge pumps are similar in nature to conventional voltage multipliers which operate on AC voltages. Such devices charge capacitors, and effectively "stack" the voltages of the charged capacitors to achieve a desired higher, or alternate, voltage. In the present device, small capacitors are easily formed in the substrate using well known principles. Since virtually no current is required for operation of the depletion gates 28 and 30, the necessary voltages may be developed with very small capacitors (on the order of a few picofarads) which is easily achieved on the substrate material. While an on-board oscillator could be incorporated to operate the charge pump, such a scheme would place a continuous drain on gate input 36. More preferably, the charge pump 38 could collect electrical charge for its capacitors during transitions of the signal applied to gate 36. While such a scheme is dynamic in operation, requiring periodic transitions of gate 36 to refresh the charge on the capacitors, it is contemplated that the inventive device would find application in devices where refreshing would occur continuously. In addition, it should be noted that, for the device to initially become functional after a circuit is powered, several cycles of the gate 36 may be required to initially charge the capacitors. Where refreshing and the initial charging are unacceptable, the charge pump could steal its charge from the voltage across the drain and source or from both the gate signal and the drain-source voltage.

Thus, after transitions of gate 36 build the voltages for depletion gates 28 and 30, gate 36 is directly used to operate control gate 30 to cause switching of transistor 34. Of particular importance is the fact that the inventive scheme does not reduce the operational speed of transistor 34. Gate 36 suffers no increase in rise or fall times or propagation delays after the charging of the charge pump. This is particularly important in light of the dramatic improvements in switching speed obtainable with quantum tunneling transistors.

As previously stated, quantum tunneling transistors exhibit a number of properties which are particularly well suited for power switching applications, namely low on resistance and fast switching speeds. Bay way of example and not limitation, radio frequency applications, motor control systems, and battery powered devices would benefit through more efficient operation, lower operating temperatures, dramatically reduced size, and dramatically reduced complexity.

As will be apparent to those skilled in the art, many popular products would benefit in a variety of ways such that the use of quantum tunneling transistors would produce benefits which would extend far beyond those inherent in the use of the device. For example, a cellular telephone would exhibit increased talk time through more efficient operation, smaller size as a result of smaller RF components, more comfortable operation since the phone would not become hot during use, and exhibit greater reliability since there is a correlation between temperature and longevity of electronic components.

Figure 4:
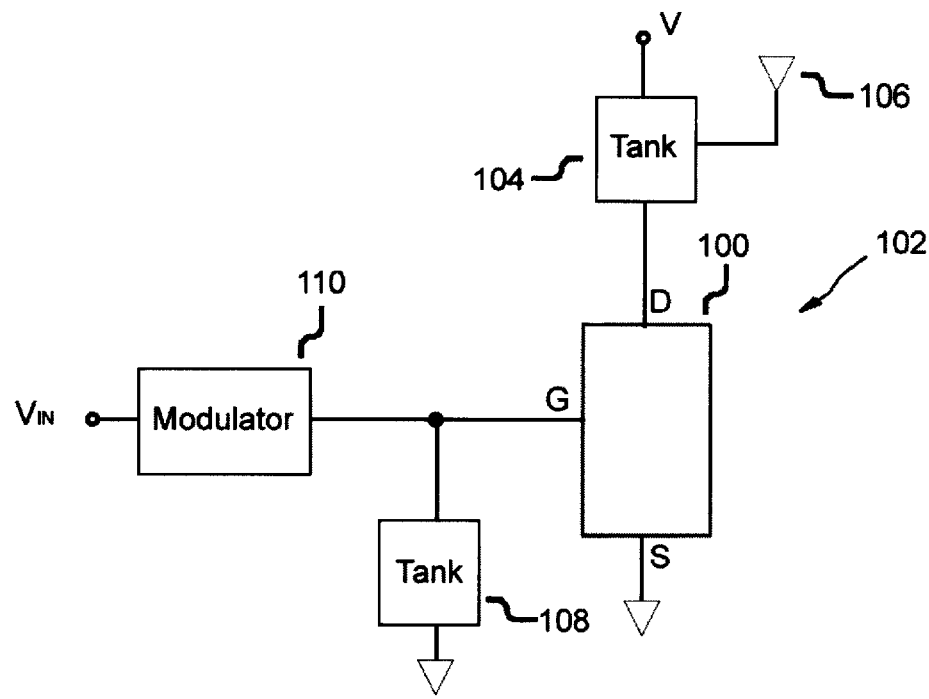
FIG. 4 provides a block diagram of a radio transmitter employing the inventive quantum tunneling transistor.

In another example, as shown in FIG. 4, a three-pin quantum tunneling transistor 100 is shown in a typical radio frequency transmitter 102. Typically, transmitter 102 includes: resonant circuit 104 coupled to antenna 106; resonant circuit 108 to filter the input to transistor 100; and modulator 110. Because of the lower "on" resistance of transistor 100 than prior art devices, transmitter 102 would produce much less heat than the same transmitter using a prior art device. Perhaps more importantly, is that with the improved speed of transistor 100, as well as improved power handling capability, the range of transmitter which may be produced with a single transistor output stage is greatly enhanced. It should be noted that a particular quantum tunneling device produced in accordance with the present invention could be used for virtually any transmitter ranging from the AM broadcast band (as low as 540 KHz) to radar transmitters operating at many gigahertz.

Figure 5:
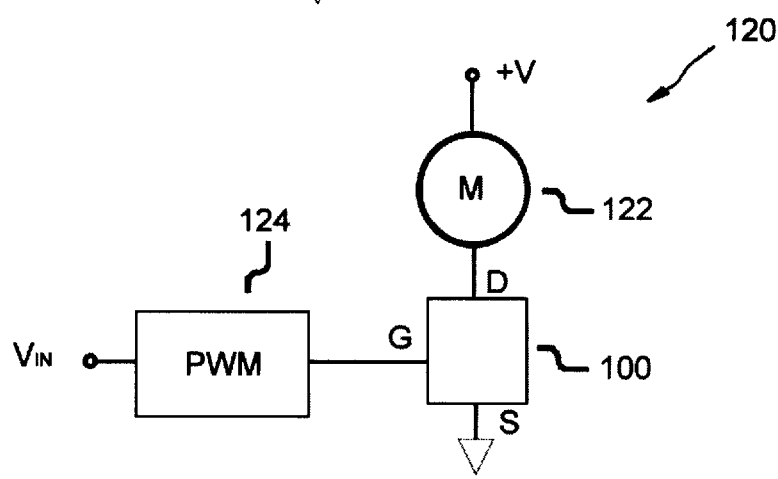
FIG. 5 provides a block diagram of a control system employing the inventive quantum tunneling transistor.

In a control system environment, as shown in FIG. 5, the inventive transistor 100 is incorporated into a motor controller 120 having a motor 122 switched by transistor 100 and a pulse width modulator 124 switching transistor 100. As will be apparent to those skilled in the art, such a controller could be found in open-loop motor control circuits (i.e., conveyors, propulsion motors for cars, trains, boats, and the like) or included as part of a closed-loop servo system (i.e., positioning systems, machine control, etc.). Beyond the obvious advantage of more efficient operation, the inventive device will also allow operation at higher frequencies and will produce far less heat caused by the inefficiency of prior art devices during switching transients. In many applications, power transistors are operated at far below the desired frequency simply because the device is unable to dissipate the power losses attributed to the transistor during switching at the desired frequency.

As will also be apparent to those skilled in the art, similar problems exist in power supply designs. Thus, by operating at higher frequencies, the inventive quantum tunneling transistor would allow the use of smaller inductors and transformers in large power supplies. Thus, beyond the obvious, the devices would allow great reductions in the size of such supplies making it superior to conventional MOSFETs and IGBTs which are presently widely used in such devices.

In yet another application, the inventive device could provide an improved rectifier. In DC power supply applications, typically a bridge rectifier (e.g., a two diode bridge for center tap applications, a four diode bridge for full wave, single ended applications, or a six diode bridge for three phase applications) is used to convert AC voltage to DC. An improvement in the efficiency of such a bridge may be obtained by providing a switched bridge using the inventive transistor. Thus, current is directed through the bridge to a filter capacitor by switching an appropriate transistor, or transistors, at the appropriate time, rather than simply allowing a rectifier to "turn on" when the voltage on the anode side exceeds the voltage on the cathode side. Typically, a silicon diode will exhibit a drop of approximately 0.7 volts. In a switched bridge configuration, the present device will instead exhibit voltage drops far below this value (preferably on the order of 0.1 volts) thus reducing the losses in the bridge by approximately seven times.

Figure 6:
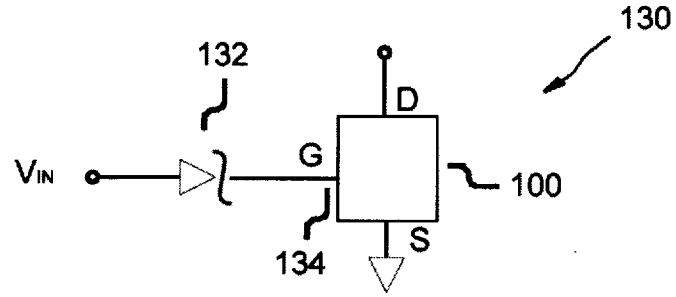
FIG. 6 provides a circuit diagram for a pseudo-diode using the inventive quantum tunneling transistor.

Turning to FIG. 6, in another preferred embodiment, a pseudo-diode 130 is formed by providing a small, high speed diode 132, such as a Schottky rectifier, in series with the control gate 134. To the degree the inventive transistor 100 may exhibit thyristor-like behavior over a range of operating conditions, reverse conduction may be avoided by preventing operation of the control gate 134 under such conditions. Thus, capitalizing on the speed of the Schottky device 132, a high speed, high power device is possible, which provides an exceptionally low voltage drop while behaving like a conventional rectifier.

As previously noted, the inventive device is intended to essentially perform as a "drop in" replacement for prior art transistors. It should also be noted that the importance of such a device lies not only in the use of discrete devices, as discussed in the previous examples, but also in the device's usefulness in integrated circuit designs. A vast array of integrated circuits is presently available. The majority of such circuits could benefit from a transistor topology which is smaller, faster, and more efficient. The present device satisfies these needs. Thus, the present device would allow rapid adaptation of existing designs to take advantage of quantum tunneling technology without the need to adapt the underlying circuitry to provide the necessary voltages and switching required for the use of other quantum tunneling devices.

Thus, the present invention is well adapted to carry out the objects and attain the ends and advantages mentioned above as well as those inherent therein. While presently preferred embodiments have been described for purposes of this disclosure, numerous changes and modifications will be apparent to those skilled in the art. Such changes and modifications are encompassed within the spirit of this invention.

What is claimed is:

1. A quantum tunneling transistor comprising:
a substrate;
a drain region formed on said substrate;
a source region formed on said substrate;
a quantum tunneling element separating said drain region and said source region;
said quantum tunneling element having a top gate, a bottom gate, and a control gate; and
a charge pump receiving an electrical charge from said control gate to provide a voltage between said top gate and said bottom gate thereby controlling the thickness of said quantum tunneling element.

2. The quantum tunneling transistor of claim 1 wherein said charge pump is fabricated on said substrate.

3. The quantum tunneling transistor of claim 1 wherein said charge pump is dynamically refreshed by transitions of a signal applied to said control gate.

4. The quantum tunneling transistor of claim 1 further including a housing, said substrate being housed in said housing, and three conductors extending from said housing, a first conductor one of said three conductors in electrical communication with said drain region, a second of conductor if said three conductors in electrical communication with said source region, and a third conductor of said three conductors in electrical communication with said control gate.

5. A pseudo-diode comprising:
a substrate;
a drain region formed on said substrate;
a source region formed on said substrate;
a quantum tunneling element separating said drain region and said source region,
said quantum tunneling element having a top gate, a bottom gate, and a control gate;
a Schottky rectifier connected in series with said control gate; and
a charge pump receiving an electrical charge from said control gate to provide a voltage between said top gate and said bottom gate thereby controlling the thickness of said quantum tunneling element.

6. The pseudo-diode of claim 5 wherein said charge pump is fabricated on said substrate.

7. The pseudo-diode of claim 1 wherein said charge pump is dynamically refreshed by transitions of a signal applied to said control gate.

8. A switched rectifier comprising the quantum tunneling transistor of claim 1 wherein said control gate is operated synchronously with an AC voltage applied between said source region and said drain region such that electrical current will only flow in a single direction through said quantum tunneling transistor.

* * * * *